(12) United States Patent
Joly et al.

(10) Patent No.: US 6,788,150 B2
(45) Date of Patent: Sep. 7, 2004

(54) LINEAR POWER AMPLIFIER

(75) Inventors: Christophe Joly, North Providence, RI (US); Richard Keenan, Medway, MA (US); John Hug, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/196,110

(22) Filed: Jul. 16, 2002

(65) Prior Publication Data

US 2003/0020545 A1 Jan. 30, 2003

Related U.S. Application Data

(63) Continuation-in-part of application No. 10/189,233, filed on Jul. 3, 2002.
(60) Provisional application No. 60/305,688, filed on Jul. 16, 2001.

(51) Int. Cl.[7] .............................................. H03F 3/04
(52) U.S. Cl. ...................................... 330/296; 330/285
(58) Field of Search ................................ 330/284, 285, 330/289, 295, 296, 305, 292, 293

(56) References Cited

U.S. PATENT DOCUMENTS

| | | | |
|---|---|---|---|
| 3,991,381 A | 11/1976 | Sechi | 330/35 |
| 5,347,229 A | 9/1994 | Suckling et al. | 330/251 |
| 5,570,065 A | 10/1996 | Eberhardt et al. | 330/296 |
| 5,670,912 A | 9/1997 | Zocher | 330/296 |
| 5,844,443 A | 12/1998 | Wong | 330/275 |
| 6,043,714 A | 3/2000 | Yamamoto et al. | 330/296 |
| 6,064,277 A | 5/2000 | Gilbert | 331/117 |
| 6,137,366 A | 10/2000 | King | 330/298 |
| 6,148,220 A | 11/2000 | Sharp et al. | 455/572 |
| 6,259,324 B1 | 7/2001 | Antognetti et al. | 330/296 |
| 6,313,705 B1 | 11/2001 | Dening et al. | 330/276 |
| 6,333,677 B1 * | 12/2001 | Dening | 330/296 |
| 6,373,339 B2 | 4/2002 | Antognetti et al. | 330/296 |
| 6,392,492 B1 * | 5/2002 | Yuan | 330/296 |
| 6,515,546 B2 * | 2/2003 | Liwinski | 330/296 |
| 2001/0040483 A1 | 11/2001 | Dening et al. | 330/296 |
| 2001/0048347 A1 | 12/2001 | Forstner et al. | |

OTHER PUBLICATIONS

Azad, et al., "Multiservice/Multirate Pure CDMA for Mobile Communications", IEEE Transactions on Vehicular Technology, vol. 48, No. 5, Sep. 1999, pp. 1404–1413.

Rulnick, et al., "Power Control and Time Division: The CDMA versus TDMA Question", 0–8186–7780–5/97 $10.00 1997 IEEE.

Hathi, et al., "Peak–to–Average Power Ratio in Higher–Order MC–CDMA".

Luo, et al., "Error Probability Performance for Coherent DS–CDMA Systems in Correlated Nakagami Fading Channels".

Ji, et al., "Turbo–Coded ARQ Schemes for DS–CDMA Data Networks Over Fading and Shadowing Channels: Throughput, Delay, and Energy Efficiency".

Tektronix, Digital Modulation Technical Series, "Measuring ACPR of W–CDMA Signals with a Spectrum Analyzer".

Golanbari, et al., "Signal Monitoring on the Downlink of Cellular CDMA Communications with Interference Cancellation".

(List continued on next page.)

*Primary Examiner*—Long Nguyen
(74) *Attorney, Agent, or Firm*—Dicran Halajian

(57) ABSTRACT

A bias circuit for a radio frequency linear power amplifier includes an input for selecting an operating mode varying in quiescent current of an output transistor. A sensor senses a current through the output transistor and a circuit biases the output transistor for maintaining linear performance in each of mode over a range of temperatures. A filter attenuates noise generated within the linear power amplifier. A tank circuit at the collector of a power radio frequency transistor, having an inductor capable of handling the collector current, resonating with a capacitor at the design frequency, permits a reduction in the required inductance and therefore higher levels of integration.

3 Claims, 16 Drawing Sheets

OTHER PUBLICATIONS

Davidovici, et al., "Wideband CDMA Acquisition System Effects on Handset Power Consumption", Golden Bridge Technology, Inc., Dec. 9, 1999.

Sunay, Lucent Technologies, "Details of Lucent's 1xEV–DV Forward Link Air Interface Proposal", C50–20001204–034.

Atmel Wireless, T0360, "3 V HBT SiGe CDMA/AMPS Power Amplifier" Preliminary Information.

Jarvinen, et al., "Bias Circuits for GaAs HBT Power Amplifiers", 0–7803–6540–2/01/$10.00 (C) 2001 IEEE.

Long, 2001 IEEE GaAs IC Symposium, "Basics of GaAs, InP, and SiGe RFICs RFIC Design Examples".

RF Micro–Devices TA0032, "A 3V HBT Power Amplifier for CDMA/AMPS Handsets", 13–165—13–170.

RF Micro–Devices Technical Article, "HBT Technology adds Power to CDMA Chip Set".

Rodwell, et al., "High–Density Mixed–Mode Microwave Integrated Circuits for Radar and Communications Systems".

Dening, "A General Purpose LNA/PA for Linear and Saturated Applications", Applied Microwave & Wireless, pp. 86–92.

Browne, Publisher/Editor, "HBT Amplifiers Boast Adaptive Bias Control", Microwaves & RF, Dec. 2001, pp. 120–123.

AT&T Bell Laboratories, Technical Memorandum, "How to make an ideal HBT and sell it too?", Work Project No. 311105–5806, File Case 38788–1.

Allgood, et al., Agilent Technologies, Agilent Clinic 2000–2001, "Comparison of the newer Hewlett Packard E8285A and the older Hewlett Packard 8924C Code Division Multiple Access Mobile Station Test Sets".

* cited by examiner

LINEAR POWER AMPLIFIER

CROSS REFERENCE TO RELATED APPLICATIONS

The present application claims benefit of priority under 35 U.S.C. §119(e) from U.S. Provisional Patent Application No. 60/305,688, filed Jul. 16, 2001, which is expressly incorporated herein by reference. Further, the present application is a continuation-in-part of prior application No. 10/189,233 filed Jul. 3, 2002, now pending.

FIELD OF THE INVENTION

The present invention relates to the field of radio frequency power amplifiers, and more particularly to power amplifiers used in cellular radio handsets.

BACKGROUND OF THE INVENTION

A Linear Power Amplifier (LPA) is typically biased with a biasing circuit about an operating point, which allows a linear relation between input signal and amplified output signal. In class "A" or "AB" linear operation, this bias ordinarily establishes a quiescent current passing through the power transistor. While other amplifier modes are theoretically possible, these create various distortions of the signal. Thus, both cost and complexity considerations typically point toward a class "A" or "AB" amplifier topology. See, U.S. Pat. No. 6,333,677 and U.S. Pat. No. 6,043,714, expressly incorporated herein by reference.

E. Jarvinen, S. Kalajo, M. Matilainen, "Bias Circuits for GaAs HBT Power Amplifiers", 2001 IEEE MTT-S describes a typical known power amplifier design.

According to known class "A" or "AB" radio frequency power amplifier designs, the signal at the collector of the power output transistor must be isolated from the power supply (Vcc), and therefore a sufficiently large inductor is selected to present a high impedance in the operating band, while supplying power to the output. Typically, large inductances require physically large devices, due to the requirement for an increased length of conductor. Further, this inductor must be able to handle the full current passing through the transistor, requiring a significant bulk of conductor. Thus, the known systems require large inductors, which, in turn, are difficult to integrate into a power amplifier module and ultimately an integrated circuit. Therefore, one deficiency of the prior art teachings is to effectively minimize the required inductance, and therefore size of the inductor, while maintaining high isolation. See U.S. Pat. No. 6,333,677 and U.S. Pat. No. 6,313,705, each of which is expressly incorporated herein by reference. In addition, in Class AB operation, as the device is more efficient but less linear, the RF amplifying device requires for improved linearity, a short or quasi-short present at the $2^{nd}$ Harmonic frequency. This can not be provided by the use of an inductance (choke) at the collector. And typically the short needs to be provided using extra components and/or more complex matching network.

An alternative technique employs a transmission line to isolate the collector. While this technique avoids the bulky inductor, the transmission line itself has a significant physical size, and poses a similar dilemma.

In many high frequency operation LPAs, silicon semiconductor technologies typically have insufficient gain, efficiency, linearity and high noise to meet competitive requirements. Therefore, other semiconductor technologies, such as GaAs (AlGaAs or InGaP), InP, SiGe and the like have been proposed and increasingly adopted. Typically, these are hetero-junction bipolar transistors (HBT), but may also be Metal Silicon Field Effect Transistors (MESFET) or High Electron Mobility Transistors (HEMT).

SUMMARY OF THE INVENTION

It is therefore an object of the invention to provide a LPA (Linear Power Amplifier) having a reduced collector isolator inductor maximum size and/or inductance, by forming a network of components which together provide the desired impedance over a broad frequency range including the operating band, base band and the $2^{nd}$ harmonic.

Preferably, this is accomplished at the collector, by providing a principal choke circuit, having a resonance frequency corresponding to the operating band, as well as a second resonant frequency corresponding to the second order harmonic of the operating band, the second order harmonic preferably depending on circuit inductances which are otherwise considered parasitic, for example the inductance of a tank circuit capacitor, therefore reducing component count and complexity. This permits a reduction in the size of the main inductor, which in turn allows higher levels of integration in a LPA module. This also permits a definitive increase in efficiency and linearity performance by the provision of the proper $2^{nd}$ Harmonic loading.

It is further an object of the invention to provide, at the base of the operating devices, a bias circuit for an LPA having a plurality of operating modes, each respective mode being generally defined by operation at a different quiescent current, wherein the higher current modes would provide higher linearity and gain for the higher operating power levels, and the lower current modes would provide increased efficiency by lowering the current drawn from the battery. The bias circuit is compensated for changes due to temperature (ideally a constant device current), while maintaining low noise performance and providing good Power Amplifier linearity.

Typical bias circuits balance a compromise between linearity performance, temperature compensation and noise. Further, in a multimode communications device, the bias circuit also needs to accommodate several operating modes such as power level and burstiness. For example, in typical CDMA systems, the dynamic range is on the order of 60 dB.

The main power transistor of the LPA suffers from changes in both Vbe and Hfe with temperature. In order to compensate for changes in Vbe, the bias circuit may include a stack of semiconductor junctions; however, in the case of a GaAs device operating on a 3.2V minimum battery supply (Vcc), this stack is limited to 2·Vbe, and consequently the bias circuit needs to remain fairly simple. In order to compensate for changes in Hfe (current gain), the current flowing into the HBT base must be controlled. According to the present invention, it has been found that the impedance (generally in the form of a resistor) between the emitter follower circuit and the bias diode is essential to a balanced performance over the full range of temperatures, its value is also directly correlated to the Noise floor at the output of the PA.

Preferably, a current mirror is provided, to feed back the current to the base of the emitter follower circuit, resulting in improved temperature response behavior. Typically, this allows all essential requirements (e.g. noise, linearity, and temperature compensation), to be met simultaneously.

As the PA will need to operate over a very broad dynamic range, it is seen that by selecting the operating mode, thus adjusting the quiescent current of the LPA, the performance, can be readily controlled. By automatically adjusting the operating point based on temperature changes, the gain within a selected mode may be maintained.

According to the IS95 specification, the ACPR must be limited to less than or equal to about −45 dBc/30 KHz firm. According to the present invention, appropriate linear behaviour is achieved through proper decoupling of stages and implementation of a bias circuit described herein.

The Output Noise Floor in receive band, particularly relevant for receiver sensitivity, should be less than or equal to about −136 dBm/Hz. The bias circuit is optimized to achieve this design parameter, in particular the selection of a noise-attenuating resistor.

When resistor selection is not enough (i.e. for a closed loop bias circuit) or as an alternative noise reduction method, the bandwidth of the bias circuit needs to be further limited to a frequency below the receive band separation from the transmit band, but higher than the baseband frequency. High bandwidth bias circuits generate excessive noise at frequencies that are later mixed in the receive band, doing so limits the noise generated at the output of the LPA. However the bandwidth should not be reduced below baseband frequencies, so that the linearity of the LPA remains unaffected. The location of the bandwidth limitation devices (typically capacitors) should be specifically chosen to limit the noise and is critical to a successful noise reduction. Using either or both methods, the noise generated by the bias circuit can be removed below the noise generated by the amplifying elements, and for example, the noise of a 2-stage 30 dB LPA is improved more than 10 dB to below −140 dBm/Hz.

Another advantage of limiting the bandwidth of the bias circuit is to improve overall design stability. By the increase of the phase margin in the controlled loop, it assures that there will not be oscillations at medium frequencies.

Preferably, a gain of a circuit for compensating the output transistor bias with changes in temperature is attenuated with a cutoff frequency above a baseband signal bandwidth and a unity gain frequency below a difference between the transmit frequency and the receive frequency.

For typical amplifiers used for hand-held cellular radios, the circuit should maintain performance over a temperature range of −30° C. to +110° C. at the mounting base. According to the present invention, the bias circuit regulates Icq with respect to temperature, to maintain adequate operation within the required tolerances over the entire temperature range. It is noted that if expanded temperature range operation is required, Icq may be compensated over a larger range, possibly using more complex schemes, which are generally not required over the normal temperature range.

Another aspect of the present invention preferably provides high efficiency performance, i.e., low current consumption over so-called "CDG" (CDMA Development Group) curves, e.g., Nc>33%+@28 dBm, Icq<50 mA. According to the present invention, it has been found that multiple operating modes may provide significant opportunities for Icq reduction. Therefore, according to this aspect of the invention, a power amplifier bias circuit is provided having two modes of operation, controllable by an input signal. Of course, further operating modes may also be provided.

Also the power amplifier may be used under higher VSWR, due to the absence of an isolator between the PA and the antenna. The bias circuit provides increased reliability by allowing the devices to operate under BvceR or BvceS mode rather than Bvce0.

In the Advanced Mobile Phone System (AMPS) mode, the harmonics must be controlled. For example, the second and third harmonics H2, H3 should be maintained at less than −35 dBc. According to the present invention, harmonic loading and traps are provided for improved linearity and reduced harmonic emissions.

These and other aspects of the invention will be apparent from and elucidated with reference to the embodiments described hereinafter.

DETAILED DESCRIPTION OF THE PREFERRED EMBODIMENTS

Figure 3A:
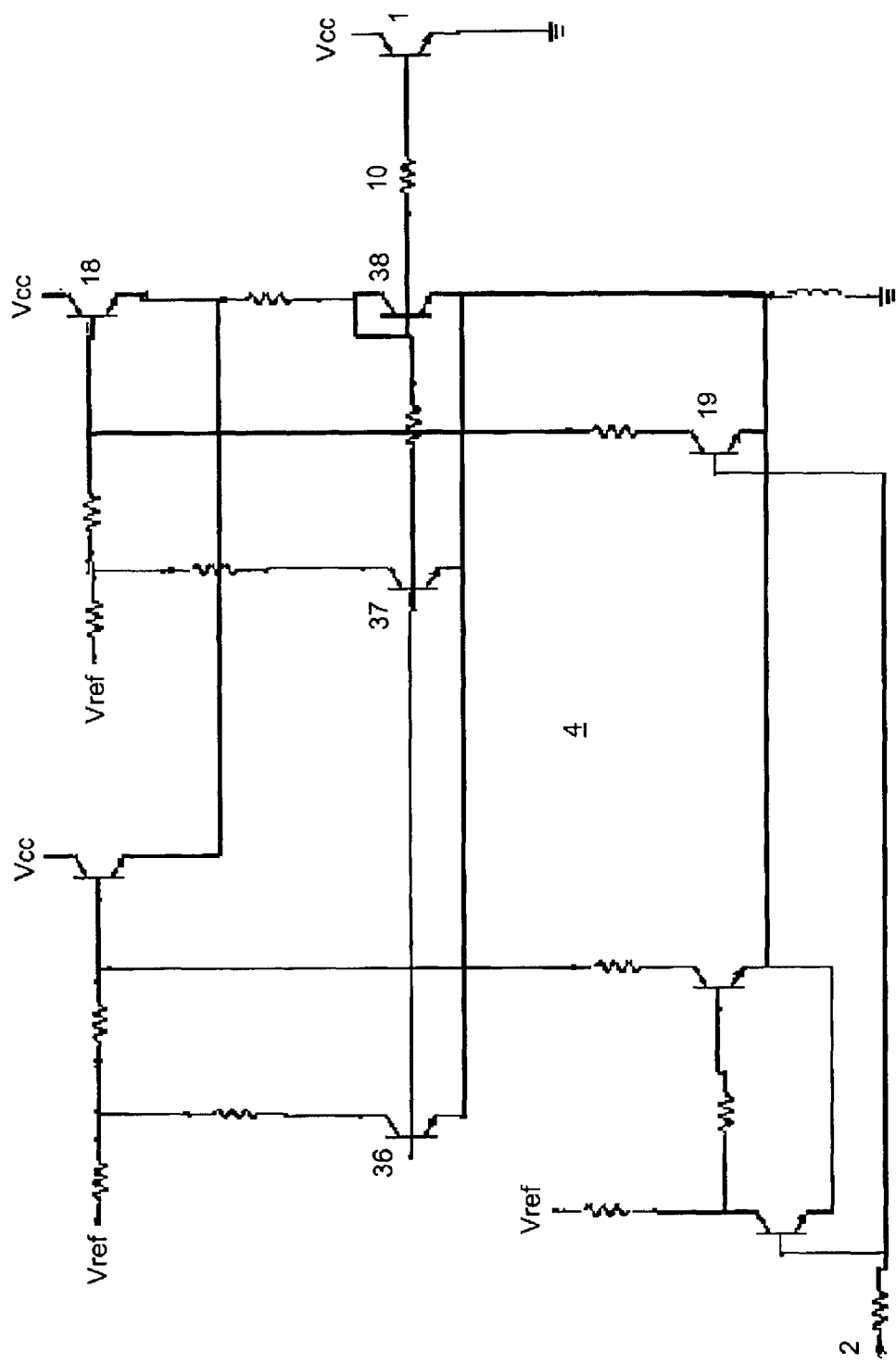
FIGS. 3A, 3B and 3C show embodiments of a dual mode bias circuit according to the present invention that provide relatively stable quiescent current with temperature of a biased transistor.
Figure 5:
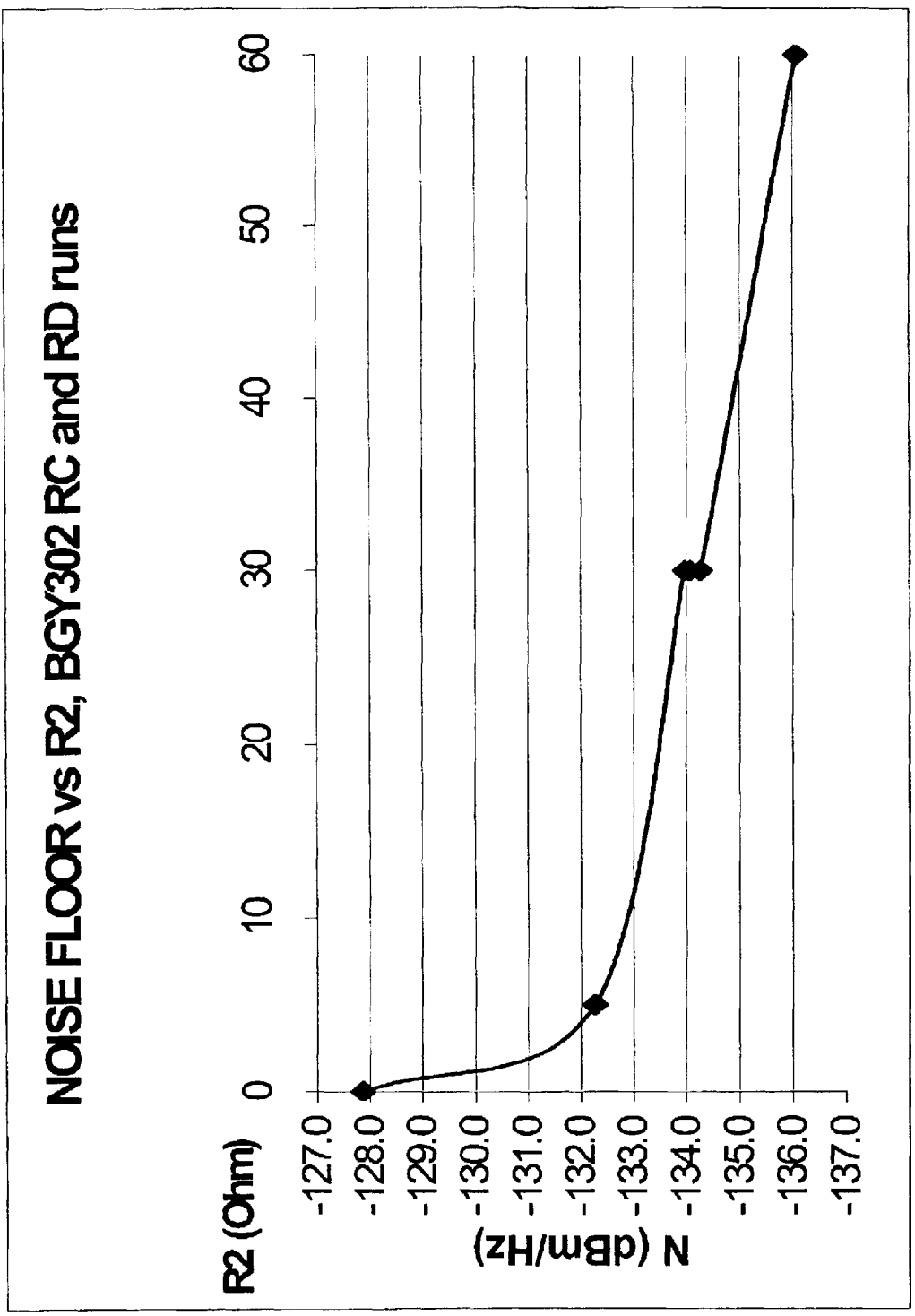
FIG. 5 shows a graph of noise floor vs. emitter follower ballast resistor value.

In a typical design according to the present invention, an emitter follower configuration of a transistor establishes a bias for the RF power transistor, as shown in FIG. 3A. In this circuit, noise becomes a significant factor. However, by properly adjusting the value of the buffering resistor between the emitter follower and the diode, it is possible to reduce the noise contributions, as shown in FIG. 5. As the value of this resistor increases, the linearity performance degrades, and there is also a detrimental effect on the temperature performance characteristics of the bias circuit. Therefore, an optimum value of the resistor is selected based on the desired noise, linearity and temperature performance.

Table 1 shows two devices that have been built and also compared using computerized simulation at 28 dBm, 836 MHz. The measured noise floor was very close to the simulated value.

TABLE 1

| R value (1st stage) | 5 Ohm | | 60 Ohm |
|---|---|---|---|
| Measured Noise power | −132.3 dBm/Hz | | −136.1 dBm/Hz |
| Simulated Noise power | −132.4 dBm/Hz | | −135.1 dBm/Hz |
| Highest contributors | Q-Emit.follower biasQ1-himod | ~25 nV | Not significant |
| | Ballast resistor for Q1 | ~10 nV each | Same |
| | Bias roes, biasQ1-himod | ~9 nV | Not significant |
| | Q-Emit.follower biasQ1-lomod | ~9 nV | Not significant |
| | RFQ1 - 1st stage | ~7 nV each | Same |

Figure 1:
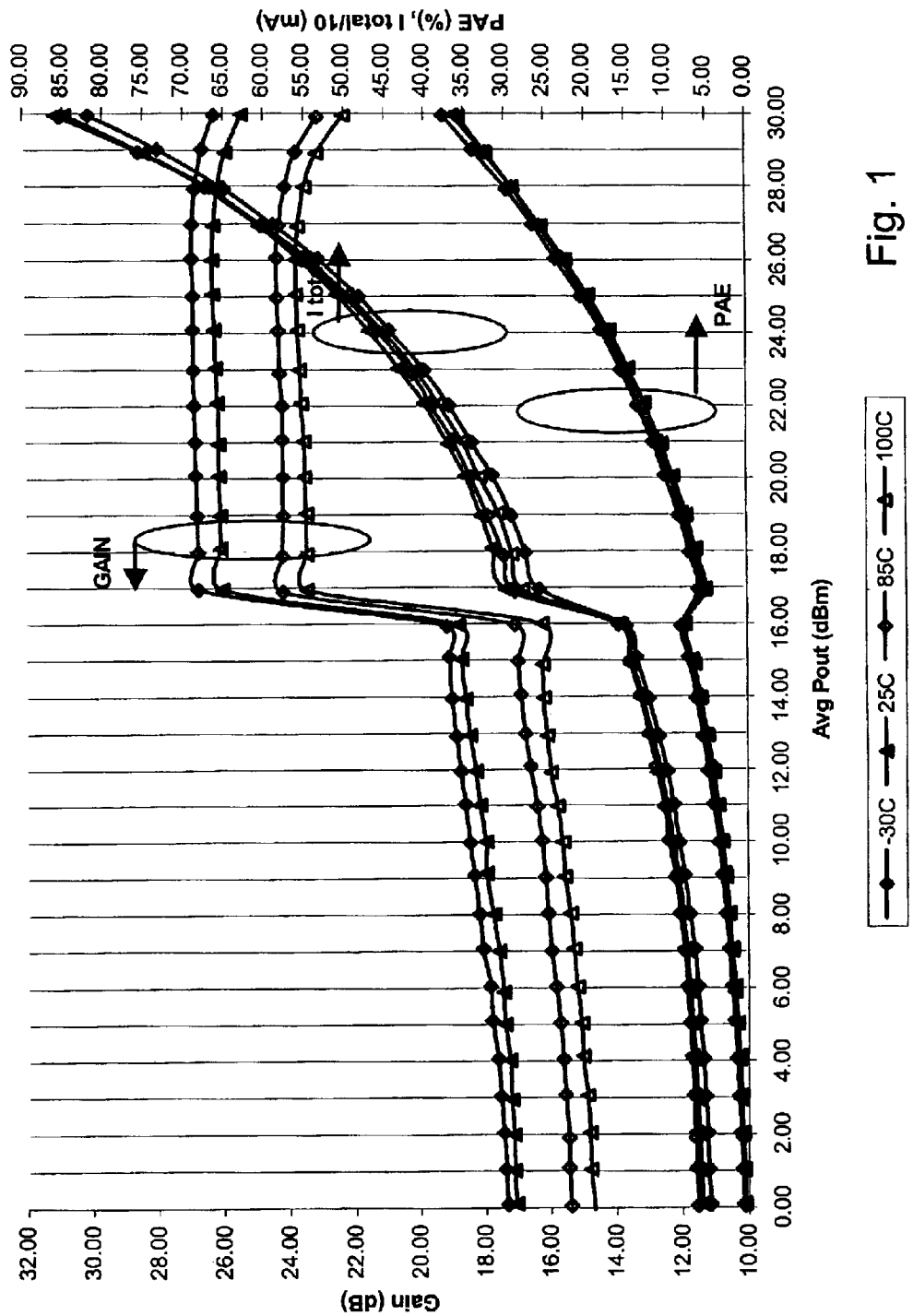
FIG. 1 shows the Gain, PAE, Normalized I total vs. Pout and Temperature for an exemplary device according to the present invention.
Figure 2:
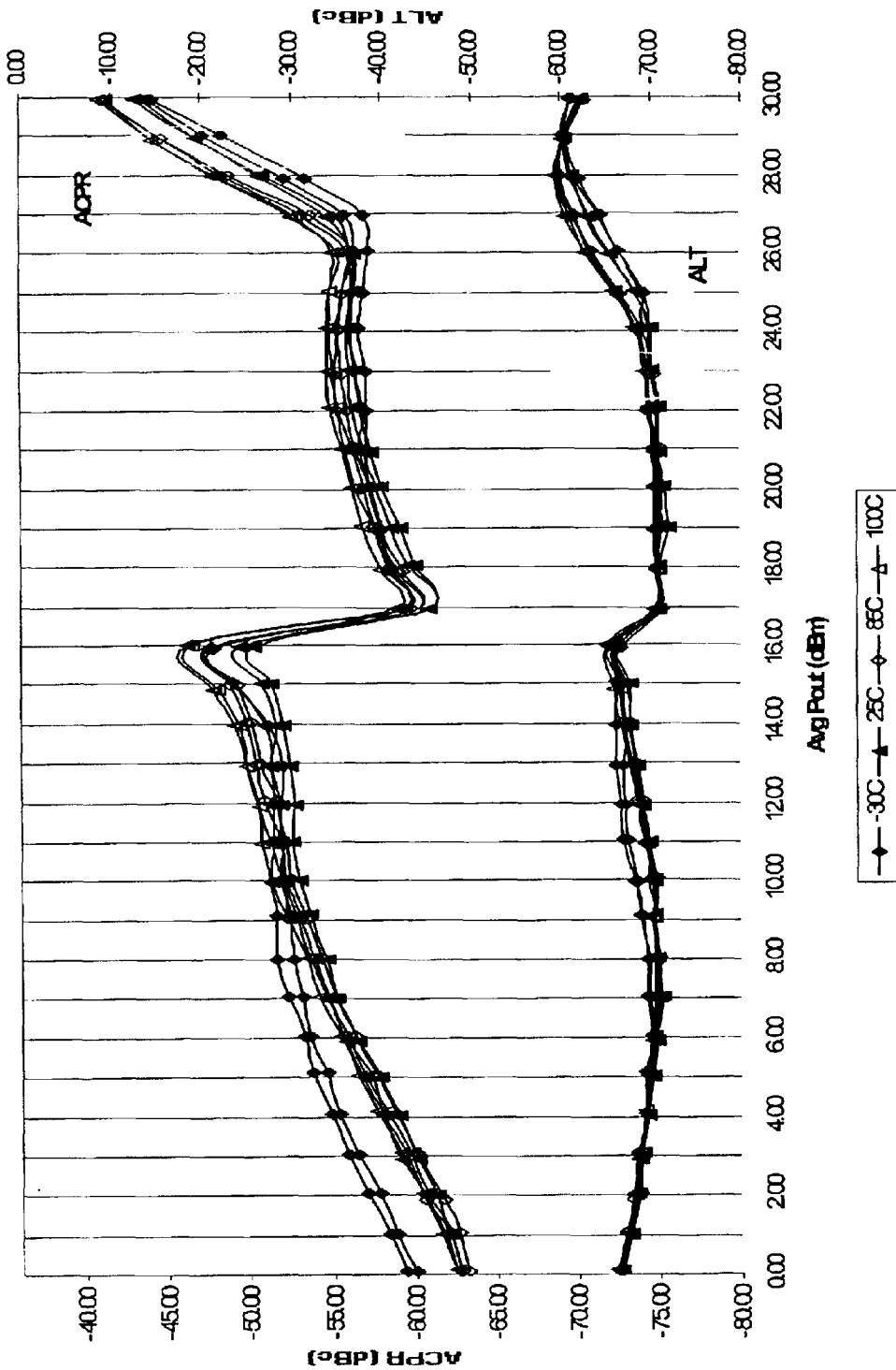
FIG. 2 shows the ACPR (Adjacent Channel Power Ratio) and ALT vs. Temperature for an exemplary device according to the present invention.

According to one embodiment of the present invention, a linear power amplifier is provided for cellular and PCS IS95 applications using AlGaAs technology and providing 28 dBm of linear power with 28 dB gain (cellular) and 25 dB gain (PCS) with a supply voltage above 3.2V (usually 3.2–4.2V, for example as provided over the discharge life of a lithium ion battery). This linear power amplifier is provided, for example, as a module having hybrid 50 Ohm terminal devices with LGA (Land Grid Array) connection, with a form factor of 6×6×1.7 mm$^3$. LTCC (Low Temperature Co-fired Ceramic) or laminates are used with 0402 SMDs (Surface Mount Devices). The GaAs die size is 1.25×1.25 mm$^2$. FIGS. 1 and 2 show the radio frequency performance measured on such a device.

Figure 4:
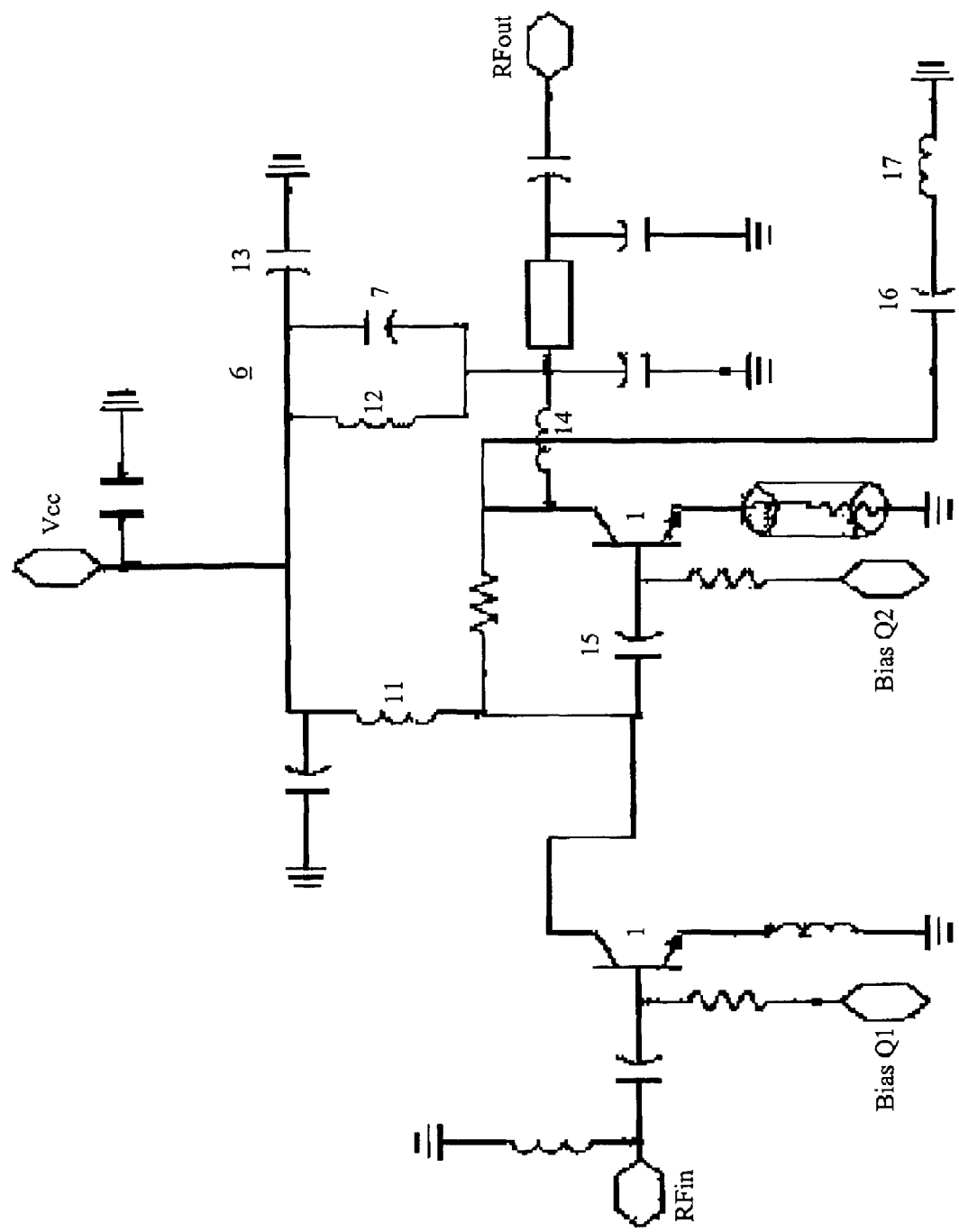
FIG. 4 shows a first embodiment of a collector isolation circuit according to the present invention.

FIG. 4 shows a power amplifier according to the present invention having two sequential active stages, with the devices matched on the module and on the die. This embodiment of the power amplifier incorporates a second harmonic trap, which has been found to provide advantageous Adjacent Channel Power Ratio (ACPR) performance. According to one aspect of the invention, this second harmonic trap employs a parasitic inductance of the capacitor to define a substantive parameter of circuit operation. This arrangement provides two advantages; first, it reduces the required inductance of the principal inductor, allowing a reduction in size, which facilitates incorporation of the trap within the power amplifier module, and potentially allows integration of the power amplifier within an integrated circuit. Second, the second harmonic trap improves the ACPR of the system. Likewise, attention to optimizing the bias circuit also assures acceptable linearity.

Figure 3B:
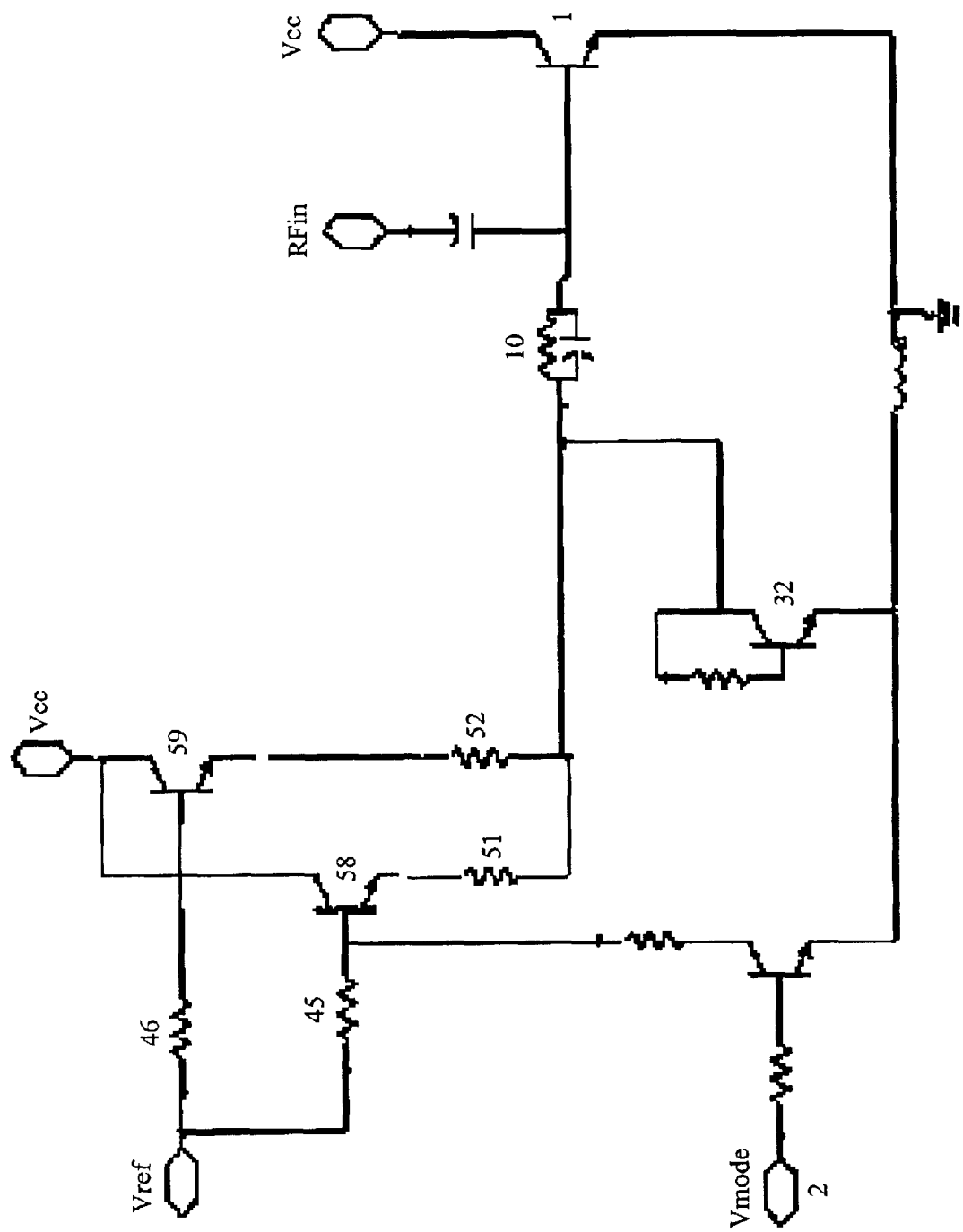
Figure 3C:
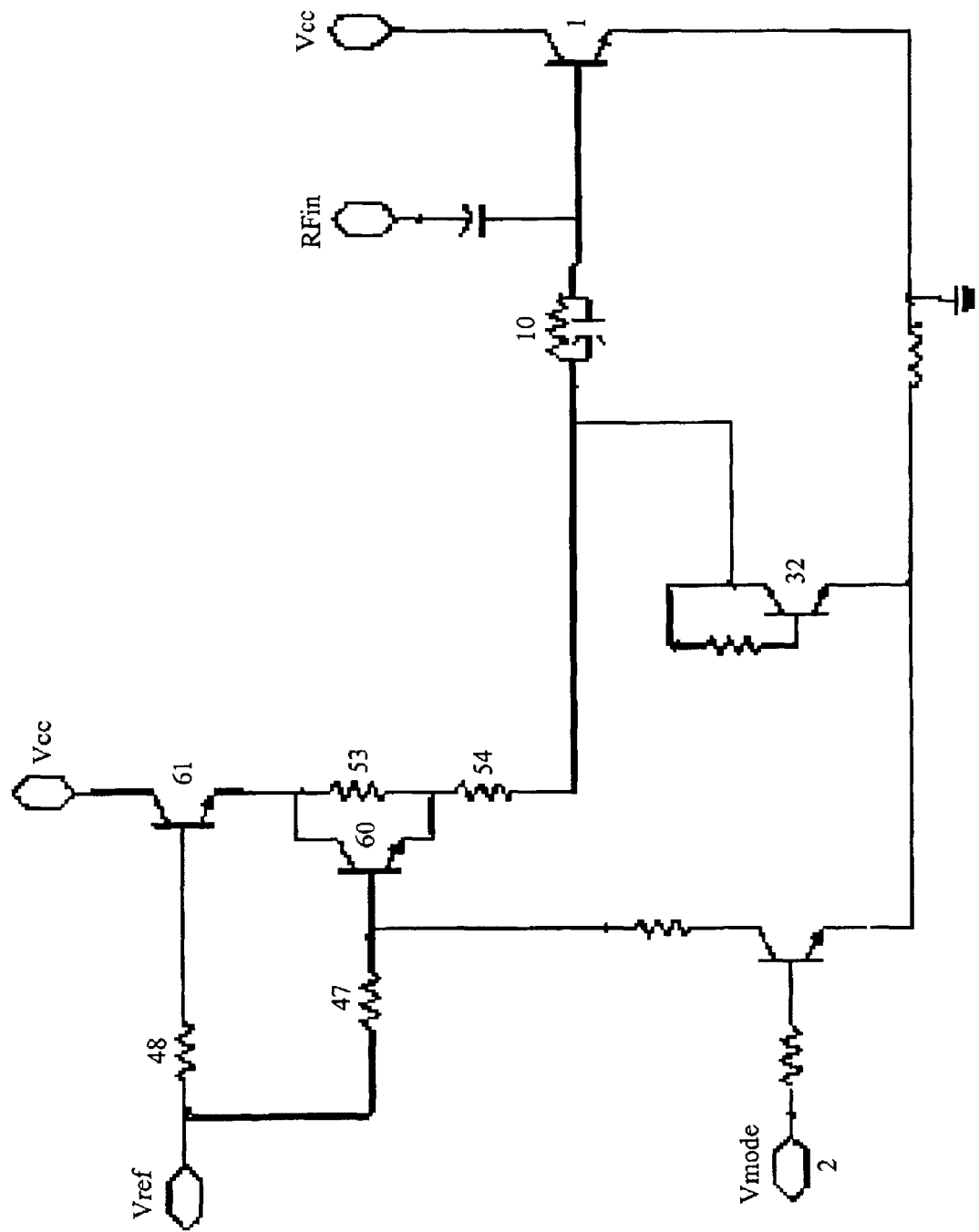

FIGS. 3A, 3B, and 3C show typical bias circuits according to the present invention. They provide an optimum compromise between linearity performance, temperature compensation and noise. These bias circuits also accommodate several operating modes for high and low power operation. Multiple performance modes are preferred for efficient operation over a wide range of power levels. Typically, for CDMA systems, the dynamic range is on the order of 60 dB. Thus, by distinguishing low power and high power modes, each can be separately optimized, each with respectively less compromise than in a single-mode design.

In designing the power amplifier circuit, several key factors dictate design parameters. For example, both Vbe and hfe vary with temperature, requiring compensation by the bias circuit of both gain and operating point variations with temperature. In addition, due to the bandgap of the GaAs semiconductor, it is only possible to stack two forward biased transistors (Vbe) with a 3.2V supply. Thus, the complexity of the bias circuit is generally limited by this architectural constraint, and thus the design must be implemented using relatively simple circuit topologies.

It has been found that, according to the present invention, the resistor between the emitter follower and the diode, as shown in FIG. 3A, is important to achieving a balanced performance at all temperatures. Typical embodiments of the invention provide an additional current mirror that feeds back a current to the base of the emitter follower circuit, to have a better performance over a range of temperature behavior; without it would be difficult to meet all requirements at the same time.

In the first stage of the bias circuit shown in FIG. 3A, the emitter follower transistor that is driving the current to the RF transistor generates noise. By properly adjusting the value of the buffering resistor between the emitter follower and the diode, it is possible to reduce the noise contributions, as shown in FIG. 5. However, increasing this resistor too much is detrimental to the linearity performance, and also has an effect on the temperature characteristics of the bias circuit. Thus, the impedance is preferably optimized to balance noise and linearity, while meeting operating specifications over the required temperature range.

FIGS. 3A–3C show embodiments of a bias circuit for a radio frequency linear power amplifier, biasing output bipolar transistor 1. The circuit has an input 2 for selecting one of a pair of independent operating modes which differ in quiescent current of the bipolar transistor 1. In FIG. 3A, transistors 36 and 37 serve as thermal sensors. As the currents through 36 and 37 are proportional to the current through transistor 1, the bias current is adjusted with temperature through the modification of the current driving the base of the emitter follower 18. In FIGS. 3B and 3C, no current mirror is provided and the values of resistors 45, 46, 47, 48 leading to the base of transistors 58, 59, 60, 61 along with the emitter resistors 51, 52, 53, 54 establish temperature compensation and quiescent current values. Transistor 38 provides breakdown voltage protection for the output bipolar transistor 1, as well as assuring that the impedance presented by the biasing circuit 4 remains low at baseband frequencies (thus assuring linearity). The bias circuit 4 maintains linear performance in each of the available modes of operation over a range of temperatures.

FIG. 4 shows a collector biasing circuit for output bipolar transistors of a linear power amplifier. In this case, the amplifier is a two stage design, and each output transistor has a corresponding base bias circuit. A second harmonic trap 6 is provided for the second stage output transistor 1', for attenuating second harmonics of an input signal. Capacitor 7 and inductor 12 act as a trap circuit operating at the fundamental frequency, while the capacitor 7, with its internal inductance and other circuit inductances, for example the inductance of bypass capacitor 13, and the contributing inductance 14 of the bond wire, acts as a second harmonic trap 6. It is less critical to provide a second harmonic trap for the first stage of the amplifier employing transistor 1, although this may be provided. Inductor 11 and capacitor 15 act as an interstage matching circuit between the two stages. All of the other shown elements are part of the matching circuit at the fundamental frequency, with the exception of capacitor 16 and inductor 17, which form an optional alternate second or higher harmonic trap circuit.

The transistors 36, 37 form a current mirror which provides a stable current with changes in temperature to the collector or output bipolar transistor 1.

Transistors 18, 19 are each configured as high gain emitter followers, which amplify the current and provide a low impedance presented by the bias circuit to output transistor 1, through base bias resistor 10.

Figure 6:
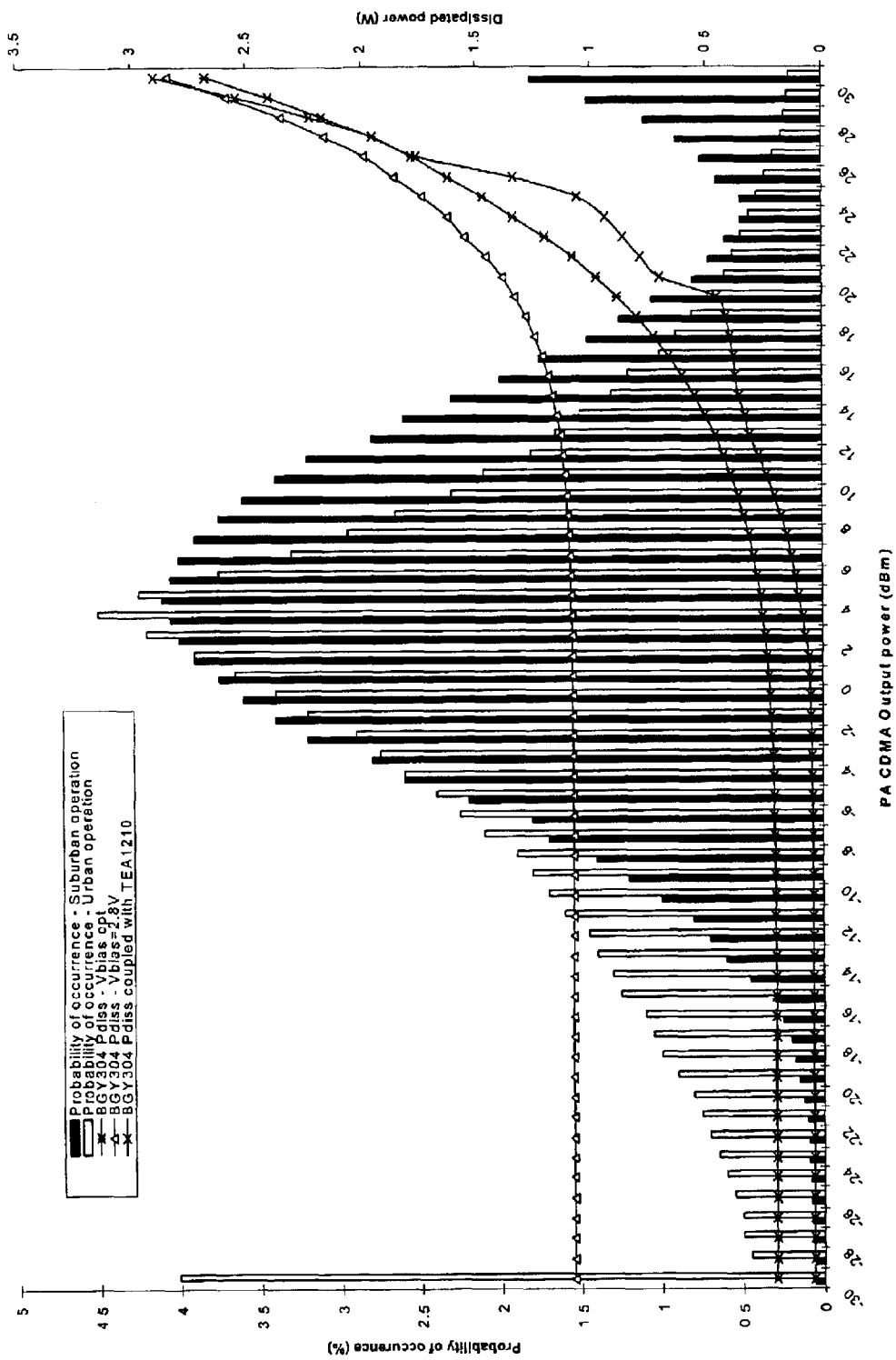
FIG. 6 shows a chart of used power vs. delivered power.

As shown in the Histogram of FIG. 6, in a CDMA system, the power generated by the power amplifier is low most of the time, with the power level mode centered around 0~5 dBm. Therefore, in order to achieve high average efficiency over time, the Icq for normal operation must be kept low. According to the present invention, the bias circuit of the power amplifier is provided with several operating modes, allowing a low average Icq to be maintained at lower power levels while still meeting ACPR.

Another method that can be used to reduce dissipation at lower power levels is to use a DC/DC down converter, which adjusts Vcc as a function of power level. As can be seen in FIG. 6, the dissipation at lower power levels is significantly lower when using a DC/DC converter, compared to operating at a constant battery voltage (3.2V in the provided measurements). The resulting reduction in average power dissipated can significantly improve the handset talk time, as shown in Table 2. In Table 2, a power amplifier, optimized and tested for a higher 30 dBm power level is employed. The battery life increase is hypothetical and was computed for a handset dissipating 1 W without the power amplifier.

TABLE 2

| P is the average power used by the PA | Suburban operation | Urban operation |
|---|---|---|
| Operation stand-alone, Vcc = 3.2 V Vref = 2.8 V constant | P = 1.21 W | P = 1.13 W |
| Operation varying Vcc optimized with TEA1210TS DCDC converter | P = 0.31 W Battery life increase by 69% | P = 0.16 W Battery life increase by 84% |
| Operation stand alone, Vcc = 3.2 V, varying Vref to optimize Icq | P = 0.48 W | P = 0.33 W |

It is noted that the current cellular communications networks are transitioning to higher bandwidth capacity. For example, 1XRTT is the first phase of CDMA2000 (2.5 G in the US). It is a CDMA system using the same spreading rate as IS95, and therefore provides compatibility with existing systems while affording some of the advantages of the newer standards. The power amplifier according to the present invention is applicable to such newer systems and standards as well, since linearity and power efficiency are concerns in these systems as well.

One of the consequences of 1XRTT is that the power amplifier will not be punctured as in IS95, to allow for data transmission as well as voice. Therefore, the importance of reducing Icq will be greatly increased to achieve a good battery lifetime. Another consequence comes from the use of Hybrid Phase Shift Keying (HPSK), which has a higher peak to average ratio under some conditions. For a dedicated-only channel, the peak to average ratio is 5.4 dB (@99%) against 3.8 dB for IS95. The higher peak to average ratio makes it more difficult to meet higher efficiencies and the required ACPR at the same time, and therefore highlights another advantage of the present design. Those two consequences will require power amplifiers to use more advanced features to improve ACPR, efficiency, such as the improved control over Icq, as are provided in the present design.

Figure 7:
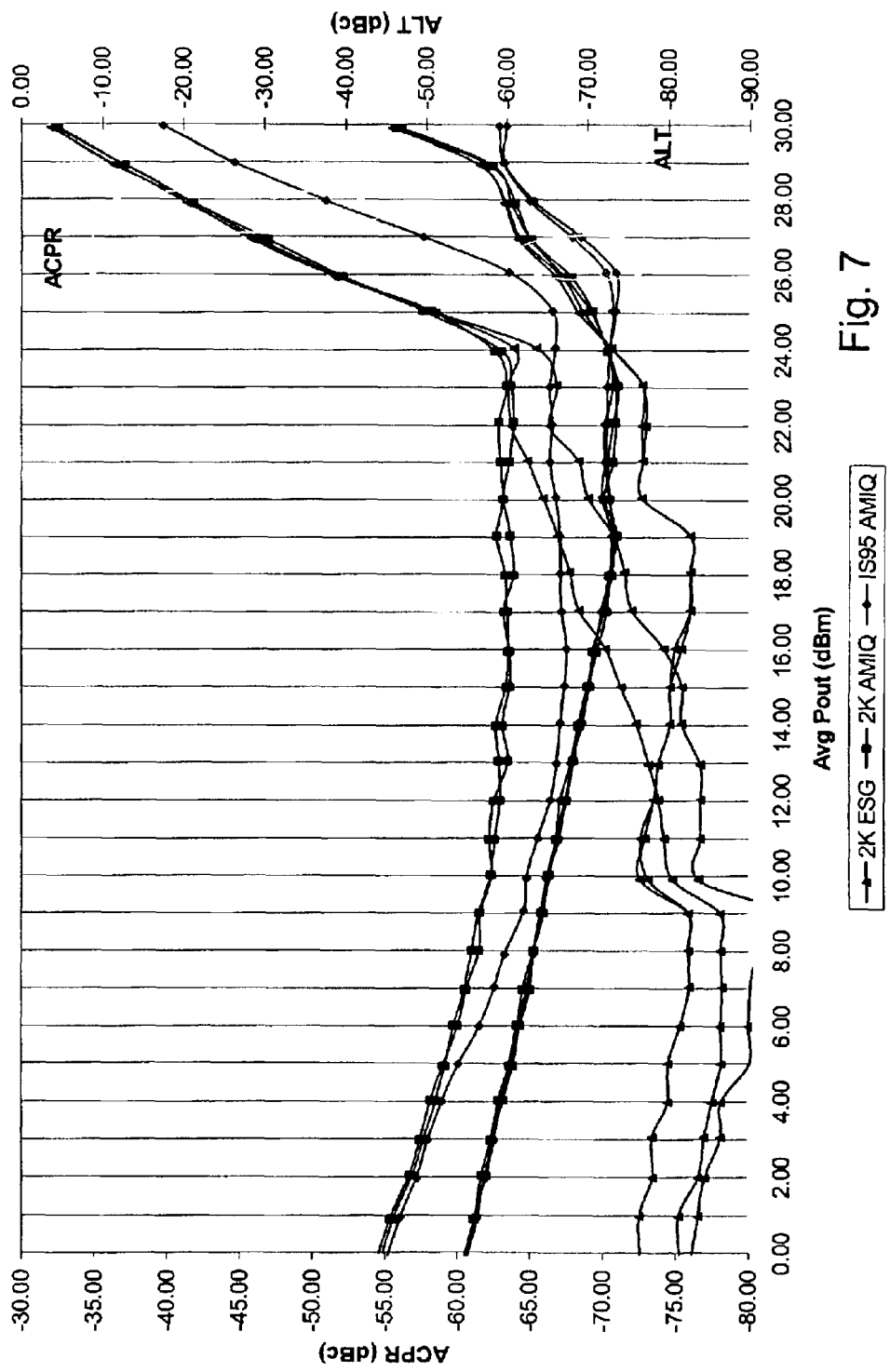
FIG. 7 shows a graph of CDMA2000 vs. IS95 ACPR and ALT vs. Pout and signal generator types.
Figure 8:
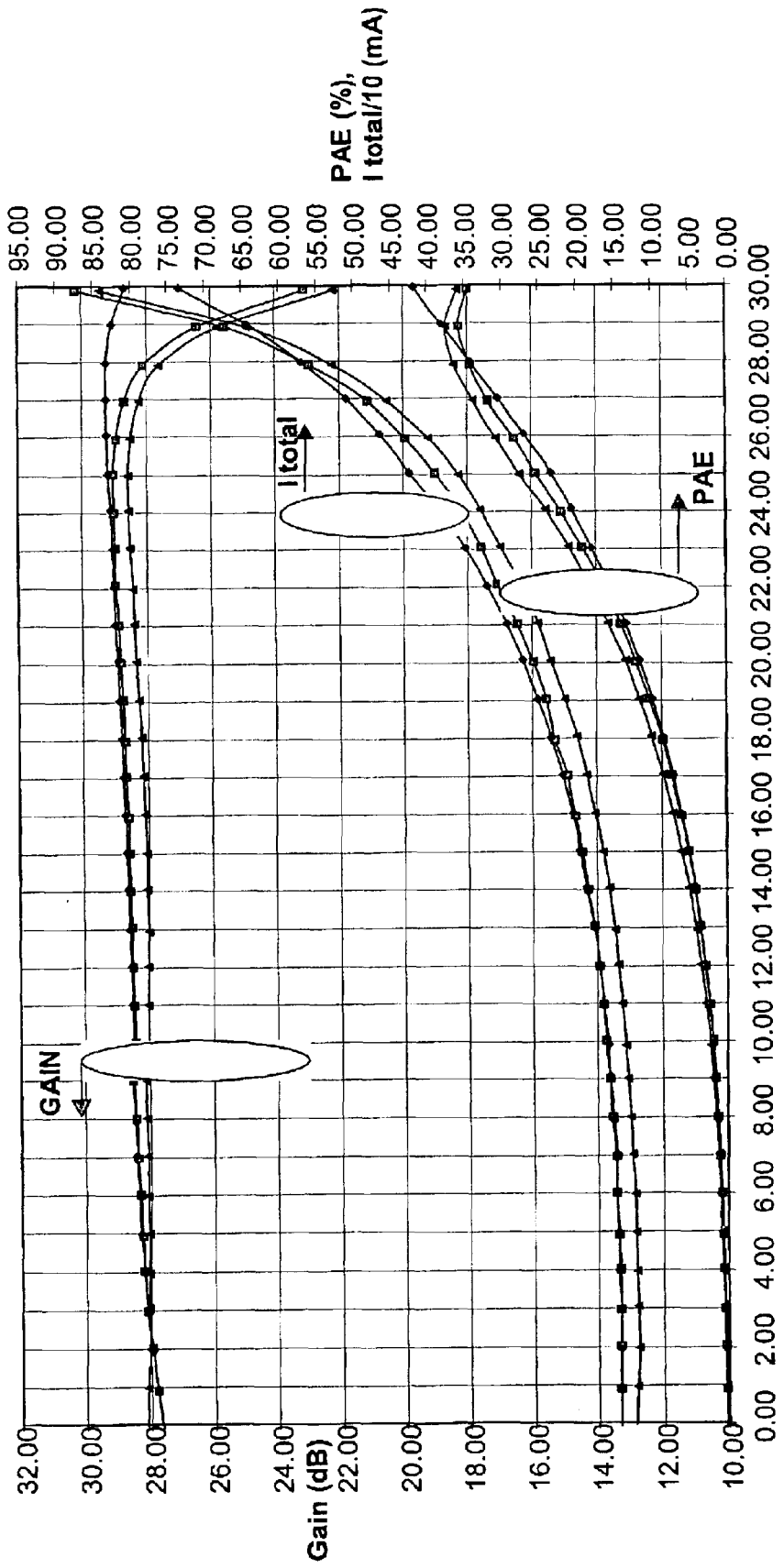
FIG. 8 shows a graph of CDMA2000 vs. IS95 Gain, PAE, Normalized I total vs. Pout and signal generator types.

FIGS. 7 and 8 show the respective performance of a power amplifier according to the present invention under IS95 and 1XRTT (dedicated-only) signals. As was expected, the 1XRTT ACPR performance is met 2 dB below the IS95 power rating, reflecting the higher peak to average ratio.

Figure 9:
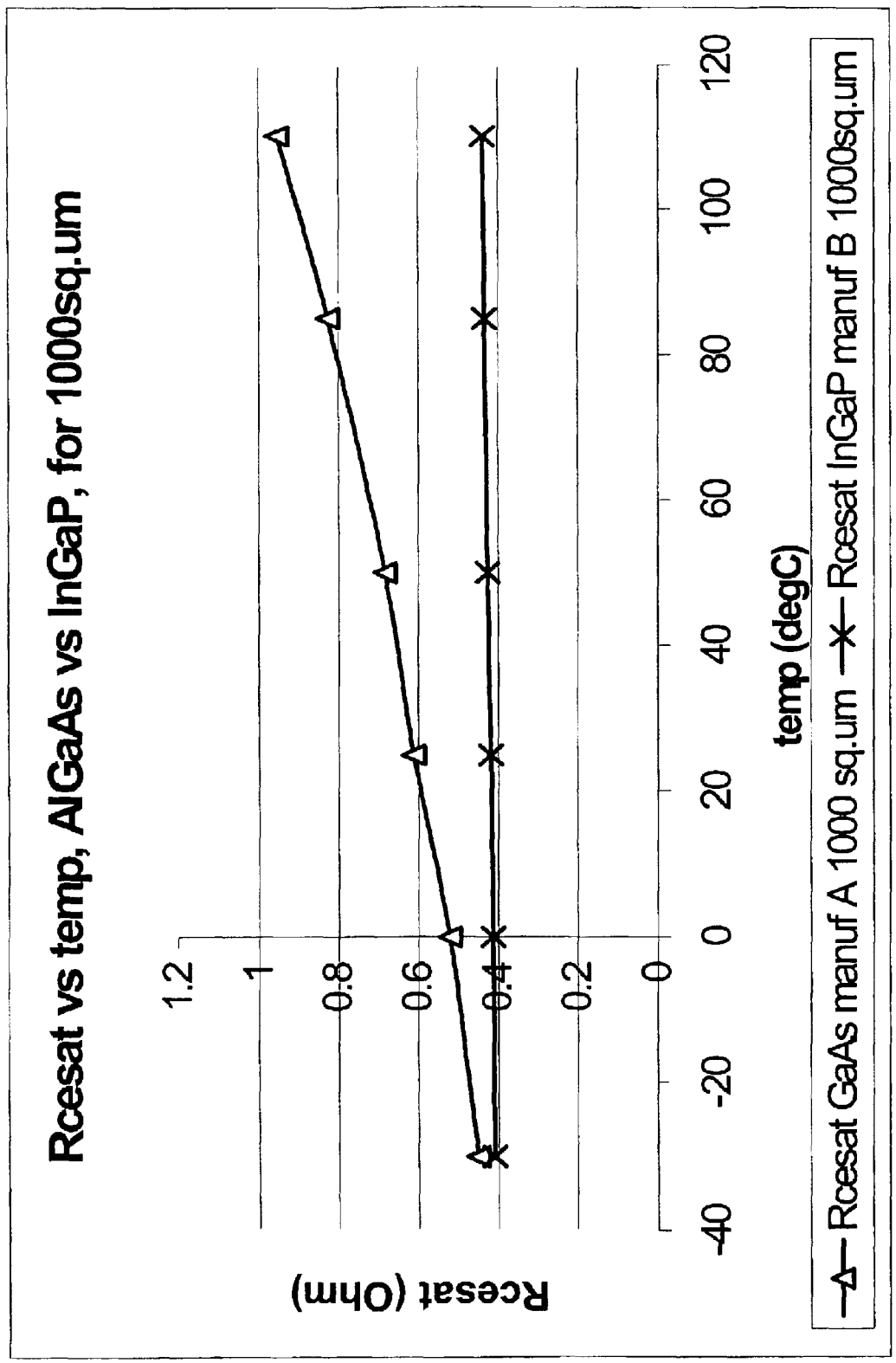
FIG. 9 shows a graph of Rcesat vs. Temperature for AlGaAs and InGaP.

Most GaAs manufacturers are moving, or have moved, from building AlGaAs devices to InGaP devices. The anticipated next step beyond InGaP is InP, when cost effective, it will provide higher thermal performance, allowing higher reliability, current density, and smaller die size, while also providing a lower Vbe. Principal reasons for moving from AlGaAs to InGaP are increased gain, increased reliability and holding hfe constant with temperature. Holding hfe constant with temperature is beneficial for obvious reasons: It allows a better Icq bias control. However it has an even more important desired effect: The Rcesat of AlGaAs is highly dependent on temperature. This is due to the dependence of Rcesat on hfe, as, at a given Vbe, both Vcesat and Icesat would increase when hfe is decreasing. If hfe drops with temperature, or is naturally low, the saturation of the amplifier occurs sooner, reducing P1 dB. This is seen with typical AlGaAs circuits at high temperatures; holding Icq to a constant level leads to a decrease in ACPR and efficiency due to lower P1 dB. FIG. 9 shows in effect how differently Vcesat behaves with temperature in AlGaAs and InGaP. Those curves were derived from models from two manufacturers of GaAs devices.

Figure 10:
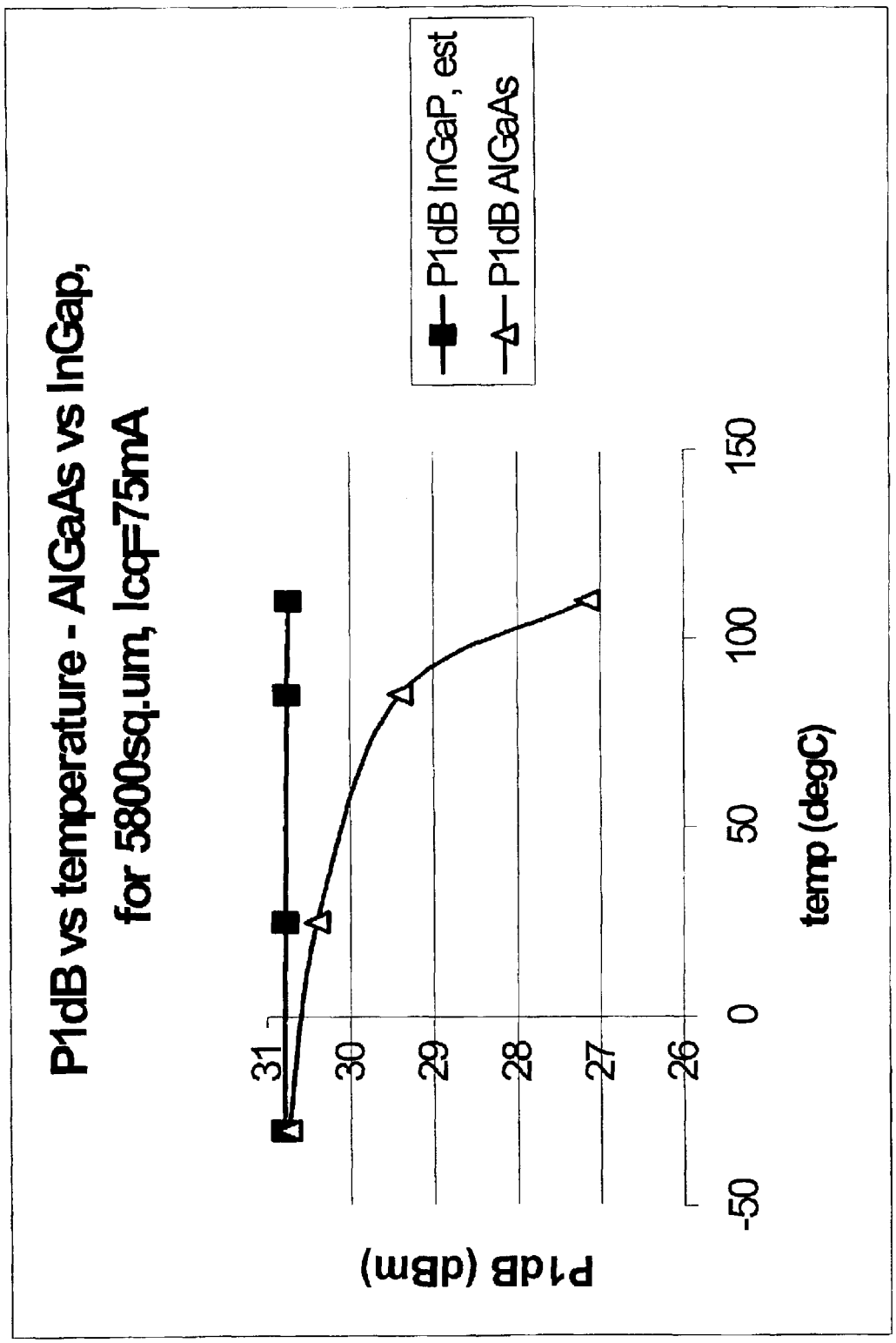
FIG. 10 shows a graph of P1 dB vs. Temperature for AlGaAs and InGaP.
Figure 11:
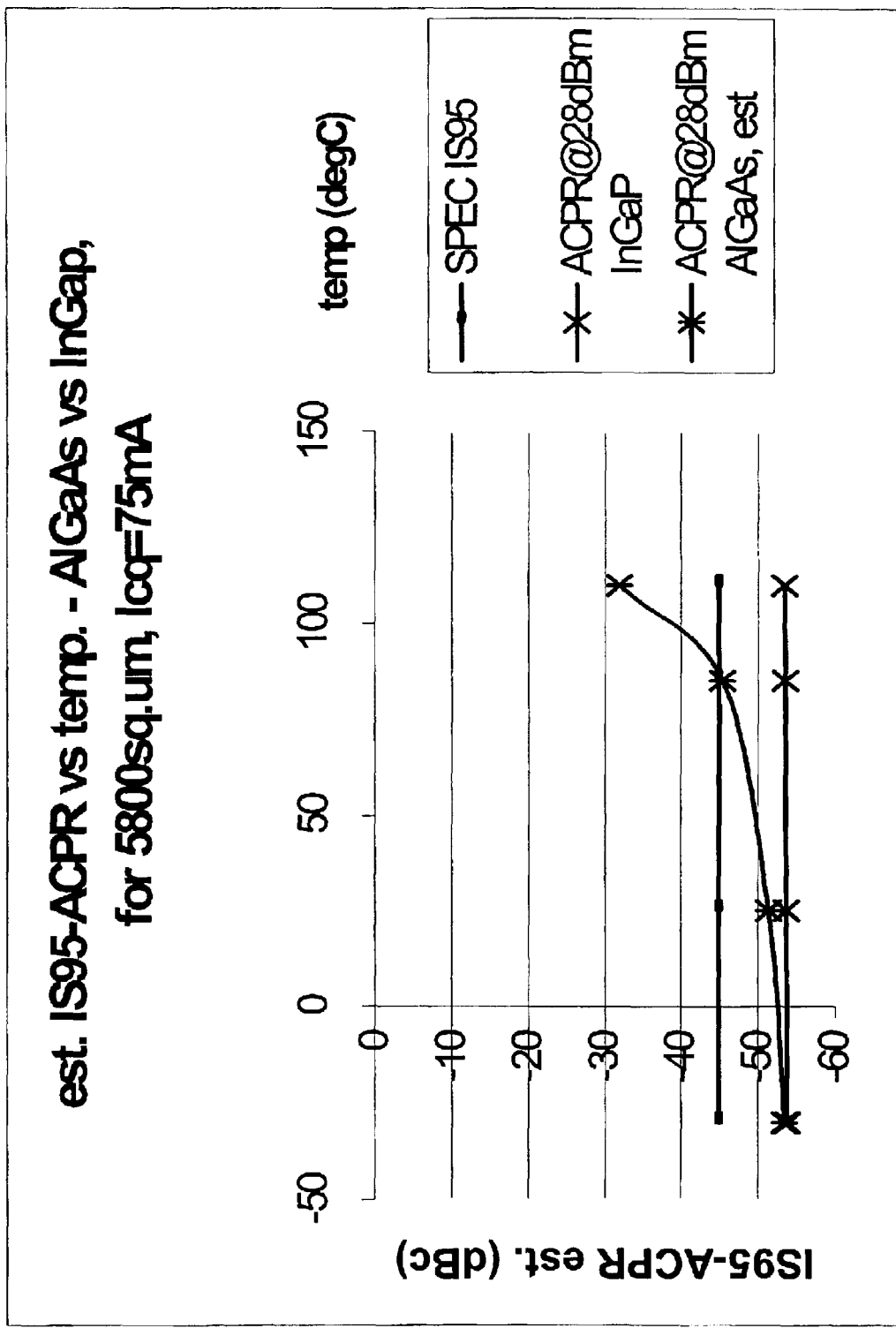
FIG. 11 shows an estimated IS95 ACPR vs. Temperature for AlGaAs and InGaP.

Looking at FIGS. 10 and 11, the consequences of the use of AlGaAs on P1 dB and ACPR are obvious, eating into the minimum Icq required for performance. The curves were derived from simulation of a 28 dBm IS95 power amplifier, using 5,800 square $\mu m$ of total output emitter area. The output stage Icq is held close to 75 mA. The lower overall Vcesat in InGaP allows a higher power capability for the same load line. InGaP therefore allows the reduction of Icq while still meeting all specifications, at higher temperatures, and therefore would be helpful in meeting ever-increasing device talk time requirements.

The circuits that are commonly used to bias transistors for linear operation, see FIGS. 3A–3C, all have the drawback that they are sensitive to hfe and Vref (Vbb) variations from wafer to wafer, as well as temperature variations of Vbe and hfe at different locations within the device. GaAs is not as good thermal conductor as Silicon and the bias circuits that are adequate for Silicon are not as easy to implement successfully in GaAs.

With both AlGaAs and InGaP circuits, it is still impossible to stack up more than two Vbe, since the characteristic voltage drop is ~1.3V. InP technology is advantageous in this regard, since the characteristic Vbe voltage drop is lower. According to an aspect of the present invention, a bias circuit is provided with current reading using a current mirror, used in a feedback control circuit similar to that found in an operational amplifier circuit. Those circuits may be implemented directly in the GaAs circuitry, or in the case of a module implementation, in a mixed technology device. In the case of AlGaAs, since hfe varies with temperature, and the relative temperatures of the diode and the RF transistor are different, it is relatively more difficult to implement this circuitry than with InGaP. 2.5 G systems are putting increased performance expectations on Power Amplifiers for noise, Icq, ACPR and efficiency over power level and temperature. Based on the analysis of Rcesat, InGaP is a preferred technology for 2.5 G handset power amplifiers. Improved biasing topologies such as that provided according to the present invention, will help meet those new requirements.

It is therefore apparent that the power amplifier according to the present invention may be advantageously implemented using various semiconductor technologies, and is not fundamentally limited to GaAs.

In addition to group III–V semiconductors, strained lattice semiconductors, such as silicon germanium (SiGe) may be employed. Use of SiGe is advantageous because it has a lower Vbe, and may be used in more complex processes, thus facilitating more complex bias circuitry. However SiGe also has a much lower BVce0 than GaAs, for example, making the diode more important. Further, an emitter ballast resistor may need to be used instead of or in addition to a base ballast resistor.

Figure 12:
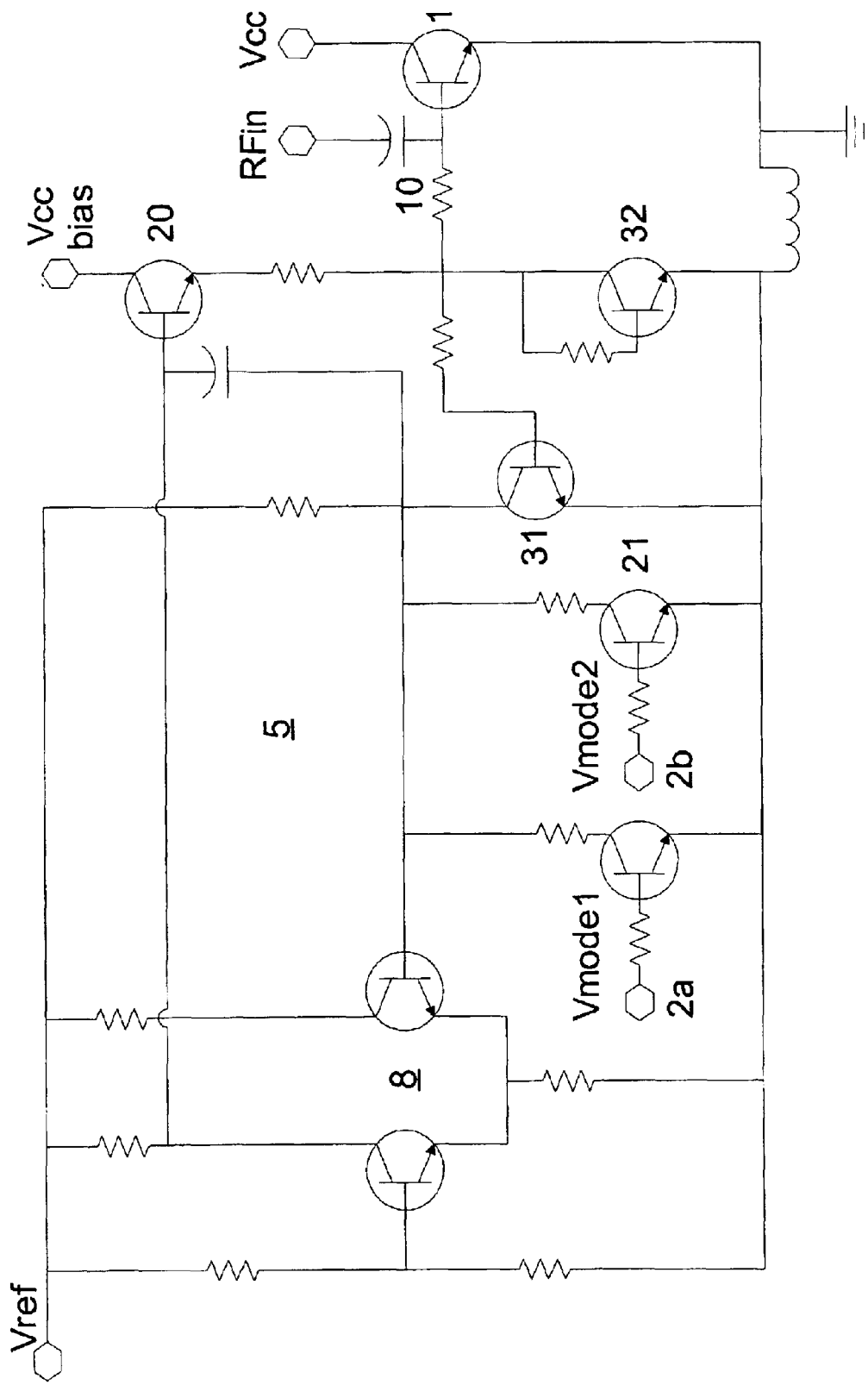
FIG. 12 shows a second embodiment of a multi-mode bias circuit according to the present invention.

The circuit presented in FIG. 12 demonstrates improvements over an earlier design (E. Jarvinen, S. Kalajo, M. Matilainen, "Bias Circuits for GaAs HBT Power Amplifiers", 2001 IEEE MTT-S), and provides independence of the bias current with hfe and Vbb. In addition, it provides two modes of operation for high and low power level and still full temperature compensation. It provides an additional diode to further improve the ACPR performance at all power levels by lowering the base band impedance presented to the RF device by the bias circuit. This diode will also provide increased stability of the bias circuit by lowering the loop gain. It also provides for an increase in the reliability and linearity of the device under higher VSWR operation, by the increase of the operating BV (Breakdown voltage). With a diode the device is allowed to operate under BvceR, or better still, BvceS condition, rather than Bvce0. This, in turn, reduces the possibility of high VSWR distortion and/or device failure that is sometimes caused by the incursion of modulated peak voltages into the Breakdown Region. Typically, a breakdown voltage under twice the maximum battery supply (often 4.2V, therefore about 8.4V) would create added non-linearity by clipping the signal at a level below device saturation. This condition is usually met in GaAs without any extra circuitry. Operating breakdown voltage should be higher still for protection under higher VSWR. For an InGaP-GaAs technology, with Bvce0=12V and BvceS=21V, the protection can be extended from about 3.5:1 up to about 16:1 VSWR.

Another improvement over prior art systems is that the present invention provides a method for discretely changing the quiescent current for multiple operating modes. This is achieved by the addition of one or more switching transistors which, when enabled in saturation, connects a resistor to the sensing side of the differential pair, thus modifying in proportion the current through the sense transistor and the quiescent current of the RF operating device, to a lower stabilized level, suitable for a less dissipative lower power operation. This method is preferred over a known analog adjustment technique; it employs a discrete (logic) current adjustment, compatible with most CDMA phones currently marketed.

As shown in FIG. 12, a bias circuit 5 includes a differential transistor pair 8, which has a negative feedback control loop including gain elements 20, 21. At the positive input of differential transistor pair 8, element 31 reads the current flowing through transistor 1, as it is a current mirror. The resistor at the collector of transistor 31 converts the current into a voltage reading. The output of differential transistor pair 8 drives the emitter follower 20, supplying current to the base of the mirror defined by transistor 31 and transistor 1. Transistor 32 provides breakdown voltage protection for the output bipolar transistor 1, as well as assuring that the impedance presented by the biasing circuit 5 remains low at baseband frequencies (thus assuring linearity). Due to the high gain negative feedback control, combined with the sensing transistor 31, the bias circuit 5 maintains precise control over bias current with temperature, improved over the approximation provided by the bias circuit 4 of FIG. 3A. Operating quiescent current on device 1 is controlled by mode control signals 2a, 2b switching the corresponding transistor. A greater number of mode control inputs can be provided for additional current modes. In the presented configuration, because there are two mode inputs 2a, 2b, the circuit can provide 4 separate modes of operation.

Figure 13:
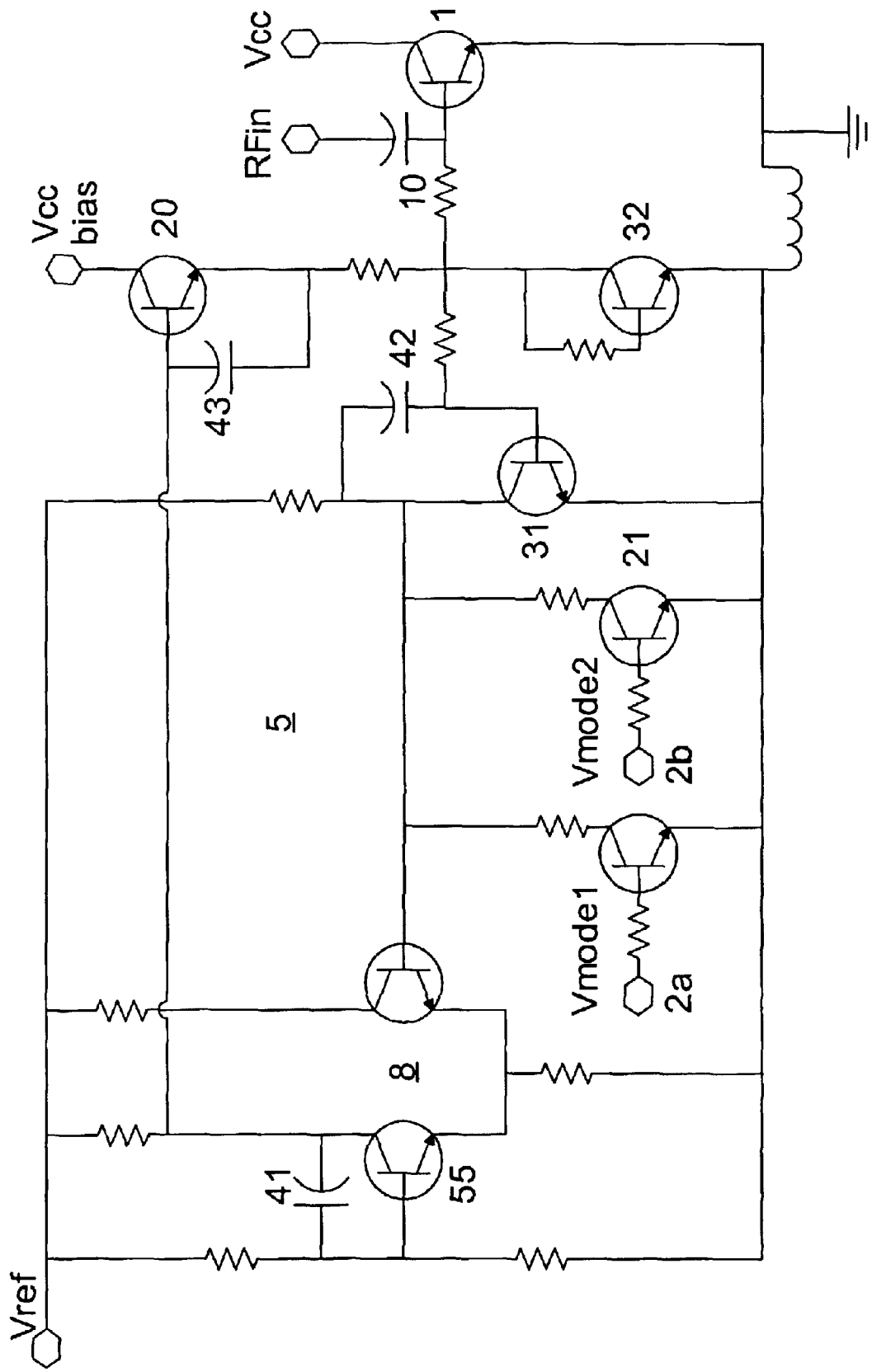
FIG. 13 shows improvements over the circuit shown in FIG. 12, having filter capacitors to improve noise performance and stability.
Figure 14:
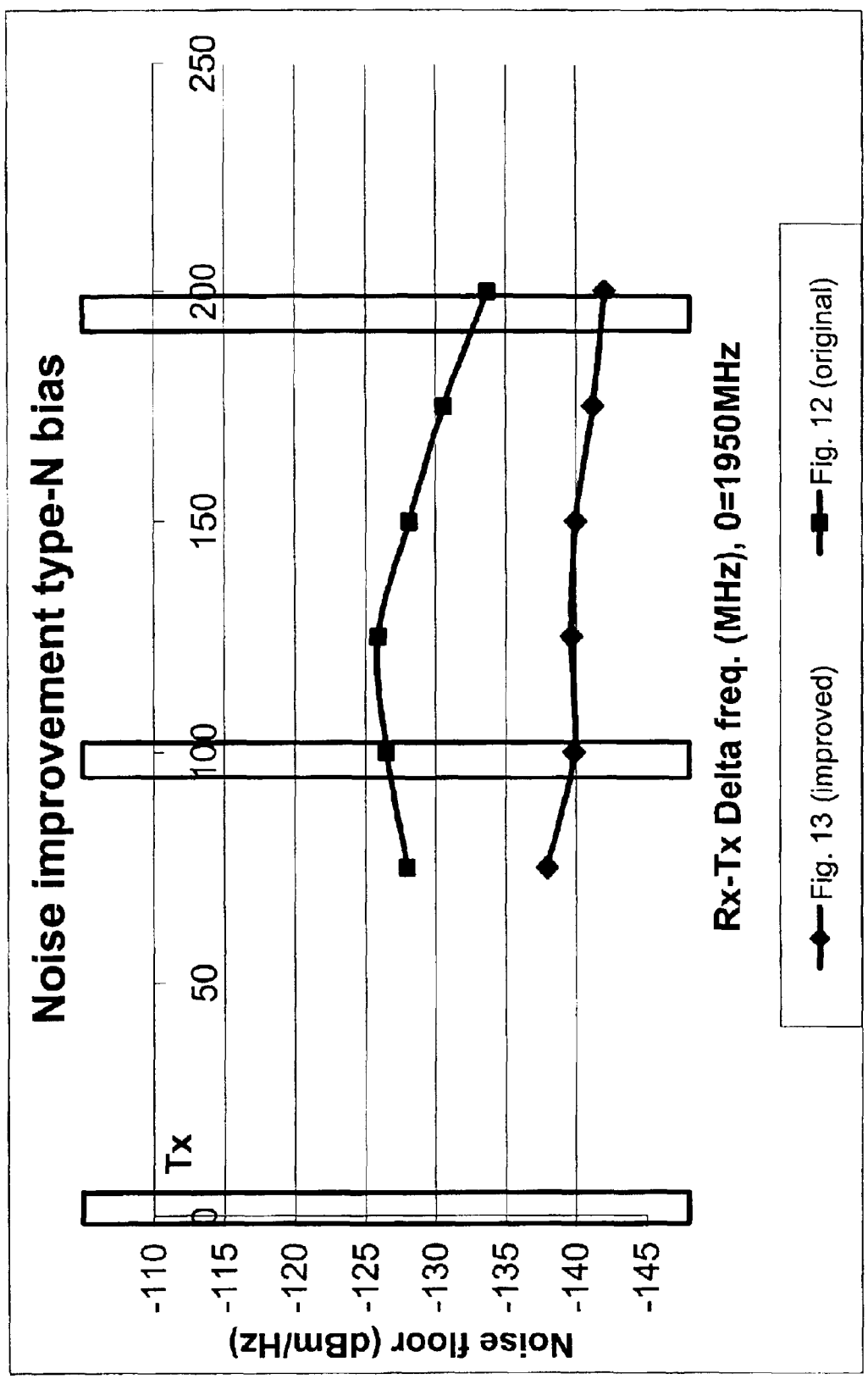
FIG. 14 shows a graph of measured noise performance of the circuits of FIGS. 12 and 13.

FIG. 13 shows an improved version of the bias circuit according to FIG. 12, having capacitors 41, 42, 43, added respectively, about transistors 20, 31 and 55. As shown in FIG. 14, the capacitors reduce noise by a factor of 10 dB. The position of the capacitors is chosen to provide maximum performance where the Noise would otherwise be amplified or generated. The positioning of the capacitors 41, 42, 43 also increases the phase margin of the bias circuit and significantly reduces the bandwidth of the bias circuit, therefore increasing the overall stability of the bias circuit. In the example provided, the capacitors increased the phase margin from about 20 to 60 degrees, while the circuit bandwidth was limited to 80 MHz (from about 800 MHz without capacitors). This limited bandwidth is quite sufficient for wide band modulation systems such as WCDMA, and adequate for limiting the noise in the receive band.

The improvements in bias circuits discussed above are useful, but may not be sufficient to meet all future requirements of the 2.5 G and 3 G communication standards. Icq and efficiency, for example, may need further improvements to meet phone maker requirements. Some examples of further techniques which may be employed to improve performance to meet these needs include: Gain switching, power amplifier bypass (i.e., for very low power output modes, avoiding the use of the power amplifier altogether), providing a second Vmode for lower Icq (i.e., providing more than two power amplifier modes), adaptive bias (allowing the amplifier bias circuit to determine the output requirements and provide a power amplifier bias accordingly, for example with a proportional control over operating status), and coupling the power amplifier with a DC/DC converter to reduce the Vcc voltage presented to the power amplifier. Thus, each of these improvements taken alone, in various subcombinations, or together, provides significant opportunity for improvements in power amplifier function.

The invention obviously applies to other network systems than those illustrated in the Figures and is not restricted to the embodiments that have just been described and represented. Other variants of the invention will be clear to a person of ordinary skill in the art, more particularly, by substitution of equivalent technical means, and these variants do not go beyond the scope of the invention.

What is claimed is:

1. A method for biasing a radio frequency linear power amplifier having an output frequency band having an output transistor, comprising:

(a) selecting one of a plurality of operating modes of a bias circuit, said operating modes differing in at least a quiescent current of the output transistor;

(b) sensing current flowing through said output transistor;

(c) biasing the output transistor based on the selected operating mode and the sensed current, in order to maintain linear performance in each of said operating modes over a range of temperatures; and (d) attenuating frequency components outside the output frequency band.

2. The method according to claim 1, further comprising connecting a transistor device to an input of the output transistor to maintain said linear performance.

3. The method according to claim 1, further comprising the step of providing breakdown voltage protection for the output transistor with a bipolar breakdown device.

* * * * *